(12) United States Patent
DeLaCruz

(10) Patent No.: US 9,435,846 B2
(45) Date of Patent: Sep. 6, 2016

(54) TESTING OF THRU-SILICON VIAS

(71) Applicant: eSilicon Corporation, San Jose, CA (US)

(72) Inventor: Javier DeLaCruz, Summit, NJ (US)

(73) Assignee: eSilicon Corporation, San Jose, CA (US)

( * ) Notice: Subject to any disclaimer, the term of this patent is extended or adjusted under 35 U.S.C. 154(b) by 20 days.

(21) Appl. No.: 14/283,116

(22) Filed: May 20, 2014

(65) Prior Publication Data

US 2014/0347089 A1 Nov. 27, 2014

Related U.S. Application Data

(60) Provisional application No. 61/825,987, filed on May 21, 2013.

(51) Int. Cl.
*G01R 31/02* (2006.01)
*G01R 31/26* (2014.01)
*G01R 31/3185* (2006.01)
*G01R 31/28* (2006.01)

(52) U.S. Cl.
CPC ......... *G01R 31/025* (2013.01); *G01R 31/2601* (2013.01); *G01R 31/2853* (2013.01); *G01R 31/318505* (2013.01)

(58) Field of Classification Search
CPC .... G01B 11/00; H04L 1/244; G01N 27/414; G01N 27/4145; G01R 31/2853; G01R 31/025; G01R 31/026

USPC .................................................. 324/755–763

See application file for complete search history.

(56) References Cited

U.S. PATENT DOCUMENTS

| | | | |
|---|---|---|---|
| 7,620,507 B2 * | 11/2009 | Richardson | G01R 27/02 702/57 |
| 7,863,106 B2 | 1/2011 | Christo et al. | |
| 8,261,435 B2 * | 9/2012 | Nagata | B32B 37/025 156/273.9 |
| 8,288,872 B2 * | 10/2012 | Chen | H01L 21/6835 257/774 |
| 8,703,508 B2 * | 4/2014 | Chang | H01L 22/14 257/737 |
| 8,791,009 B2 * | 7/2014 | Farooq | H01L 21/76898 257/E23.067 |
| 8,823,357 B2 * | 9/2014 | Shafer | H03F 1/523 324/76.11 |
| 2013/0120018 A1 * | 5/2013 | Hou | H05K 1/115 324/762.01 |

* cited by examiner

*Primary Examiner* — Melissa Koval
*Assistant Examiner* — Rahul Maini
(74) *Attorney, Agent, or Firm* — Fenwick & West LLP

(57) ABSTRACT

A system and a method for testing thru silicon vias (TSVs) in a silicon die. A silicon die containing multiple TSVs is mounted on a wafer tape. Two probe points are probed on the exposed side of the silicon die. A resistance is measured between the two probe points and an electrical integrity is determined based on the measured resistance.

18 Claims, 9 Drawing Sheets

US 9,435,846 B2

TESTING OF THRU-SILICON VIAS

CROSS REFERENCE TO RELATED APPLICATIONS

This application claims the benefit of U.S. Provisional Application No. 61/825,987, filed May 21, 2013, which is incorporated by reference in its entirety.

BACKGROUND OF THE INVENTION

1. Field of the Invention

This invention relates generally to testing of thru-silicon vias.

2. Description of the Related Art

The components in three dimensional (3D) and 2.5D integrated circuits (collectively, 3DICs) often include interconnects on both sides of the die. Thru-silicon vias (TSVs) are used to route signals from one side of the die to the other side of the die (e.g., between the top and bottom of the die). Because TSVs span the entire thickness of the die, probing both sides of the die may be desirable to test TSVs. However, due to the fragility of silicon die, probing both sides of the die is often difficult so that testing of TSVs is often omitted. This increases the possibility that a defective TSV, and therefore a defective die, will go unnoticed.

Thus, there is a need for better testing of TSVs.

SUMMARY OF THE INVENTION

The present invention overcomes the limitations of the prior art by attaching a silicon die with TSVs to a wafer tape (or other material) of known resistivity, and then measuring the resistance of an electrical path from the exposed side of the die through a TSV across the wafer tape and back through another TSV. These resistance measurements can be used to probe for shorts and opens in TSVs. In one embodiment, the wafer tape of known resistivity may be a tape used to hold the wafer during wafer sawing. In one approach, too low a resistance indicates a short circuit defect, and too high a resistance indicates an open circuit defect.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1:
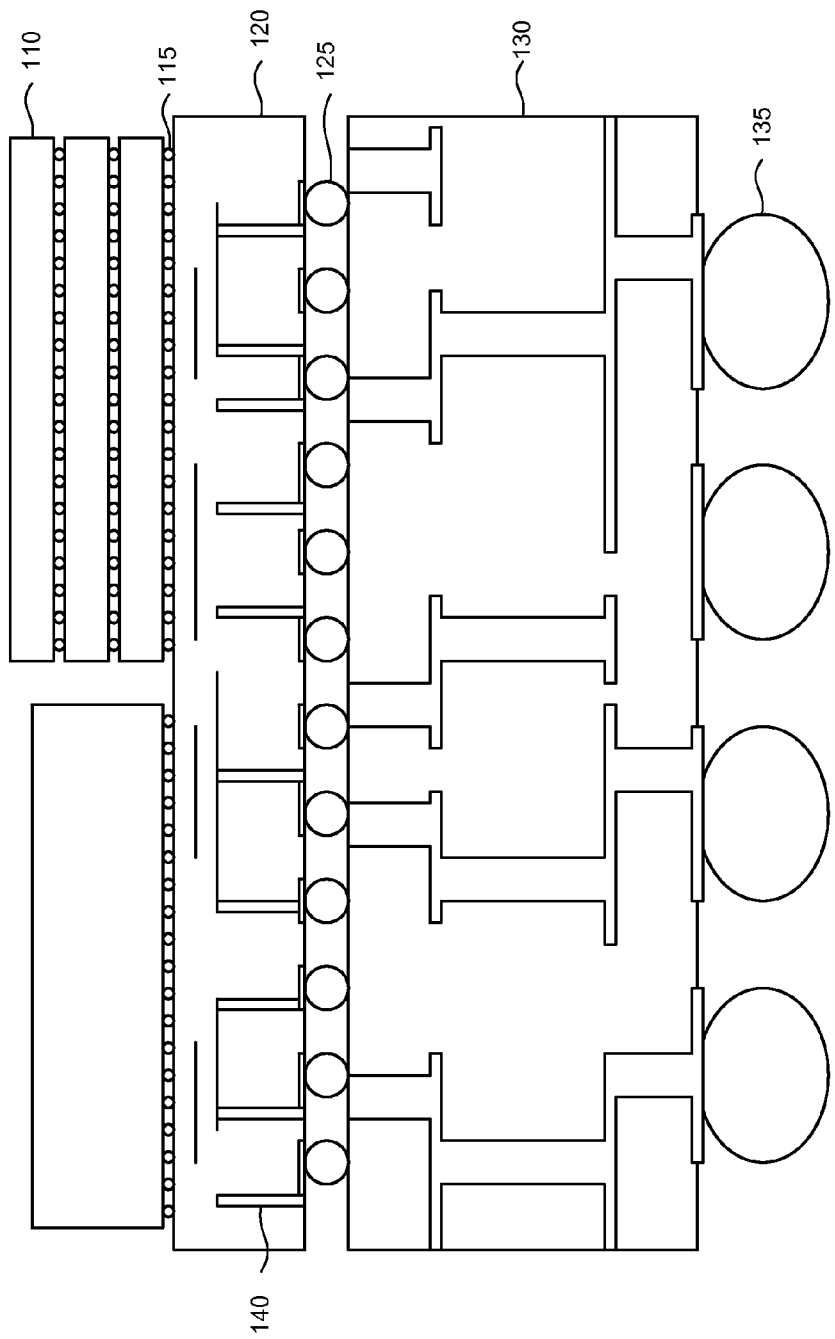
FIG. 1 is a cross sectional side view of a three dimensional integrated circuit (3DIC), according to one embodiment of the invention.

FIG. 1 is a cross sectional side view of a three dimensional integrated circuit (3DIC), according to one embodiment of the invention. A 3DIC typically includes a stack of alternating active chips and silicon interposers. As shown in FIG. 1, an exemplary 3DIC may include several tiles 110 (e.g., logic, field programmable gate arrays or FPGA, memory-stacks, integrated passive devices or IPD, etc.), a passive silicon interposer 120 and an organic laminate 130. In order to route signals, one or more of these components may include thru-silicon vias (TSV) 140.

A thru-silicon via or TSV 140 is an electrical interconnect that passes from one side of a silicon wafer or die (or other tile or component) to the other side. TSVs may route signals from one side of the die (e.g., top side of the die) to the other side of the die (e.g., bottom side of the die).

To create an electrical connection between the components of the 3DIC (e.g., tiles 110, interposer, etc.), each component may include solder balls. Depending on the type of component or technology used to design the component, the solder balls can be microbumps 115, bumps 125, or balls 135. For example, tiles 110 may use microbumps 115 to create electrical connections between each other and with the silicon interposer 120. The silicon interposer 120 may use bumps 125 to create electrical connections with the organic laminate 130. The organic laminate may then use balls 135 to create electrical connection with an external circuitry.

Since TSVs are used to route signals in a 3DIC, it is important that TSVs are fabricated without manufacturing defects. One type of defect is an open circuit or "open," meaning that the TSV does not provide an electrical connection between the two sides of the die. For example, the TSV metallization may be broken or incomplete. Another type of defect is a short circuit or "short," for example if the TSV shorts to another TSV or other interconnect (e.g., a metal trace). This might occur if adjacent TSVs are not fully separated during fabrication or if adjacent solder balls contact each other during solder reflow.

As a result, it would be useful to test TSVs for defects. However, one end of a TSV connects to one side of the die while the other end connects to the other side. To test the TSV interconnect through the die, probes would have to contact both sides of the die simultaneously. This is difficult to do.

Figure 2A:
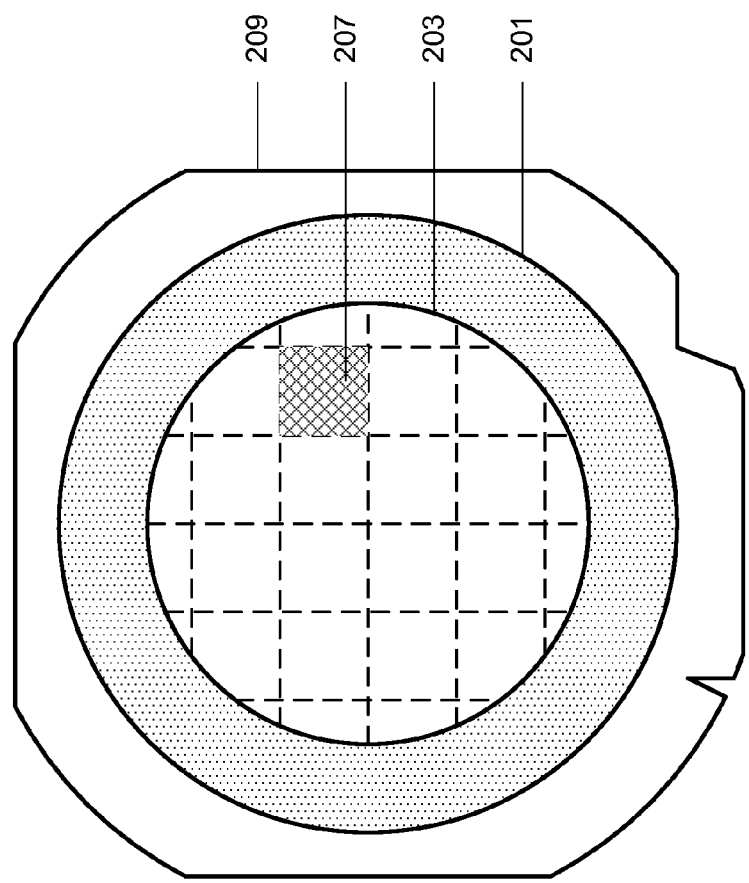
FIG. 2A is a top view of a setup for testing TSVs, according to one embodiment of the invention.
Figure 2B:
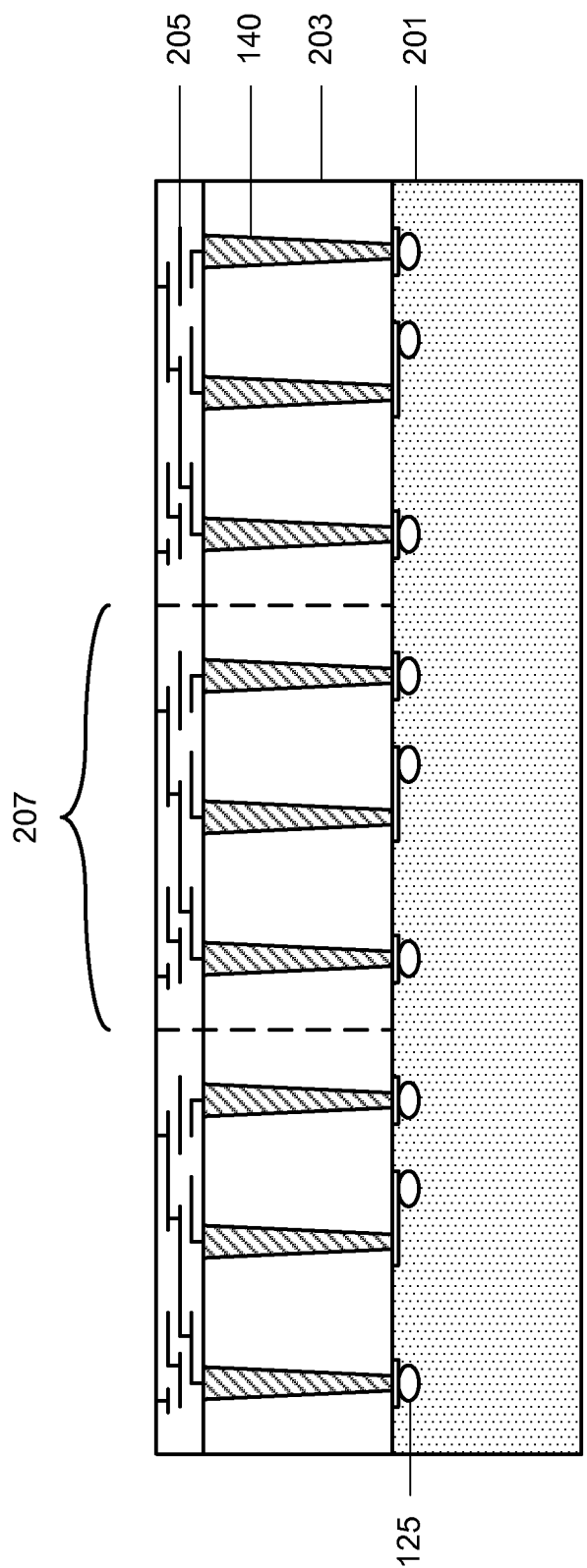
FIG. 2B is a side cross sectional view of a setup for testing TSVs, according to one embodiment of the invention.

However, FIGS. 2A and 2B are a top view and a side cross sectional view of an alternate approach for testing TSVs in a silicon interposer 120, according to one embodiment of the invention. In this setup, a silicon wafer 203 containing multiple dies 207 is mounted onto wafer tape 201. In some embodiments, the wafer tape 201 and the wafer 203 are mounted on a wafer ring 209 or other support device. The silicon wafer contains silicon interposers 120. This is commonly done during the sawing (or dicing) process to separate individual die from the wafer. The wafer tape 201 has a resistivity that is low enough that the wafer tape can conduct some electric current. Preferably, the resistivity of the wafer tape is known.

In some embodiments, the wafer 203 is aligned to the wafer ring 209. Wafer ring 209 may include one or more alignment marks to align the wafer in the testing equipment and the dicing equipment. The wafer ring may also allow the wafer to be placed into a cassette for automatic loading and unloading from the test and dicing equipment.

Referring to FIG. 2B, the wafer tape 201 completes a conductive path that can be used to test TSVs. For example, current can flow from a probe point on the top side 205 of the wafer to one of the TSVs 140, down through TSV 140 to the bottom side of the wafer, through the wafer tape 201 to a different TSV 140, up through the other TSV 140 to return to another probe point on the top side of the wafer. This conductive path can be tested using two probe points, both of which are on the exposed side of the wafer. Thus, wafer probing can be confined to one side of the wafer, while still testing electrical integrity of the TSVs.

In one approach, TSVs are tested by measuring the resistance along different conductive paths. Based on the measured resistance, it can be determined whether there is a defect. For instance, based on the measured resistance, it can be determined whether there is an open circuit (e.g., a TSV is broken, metal did not completely fill the TSV hole, etc.), whether there is a short circuit (e.g., etching of a metal layer was not complete, two terminals were shorted when applying solder, etc.), or whether the TSVs behave as designed.

In some embodiments, the resistivity of the wafer tape is low enough to create a conductive path for current to flow from one TSV to another TSV, but high enough to be able to distinguish between a TSV pair that is behaving as designed and a TSV pair that is shorted or open. For instance, the wafer tape may have a resistivity of 1 k$\Omega$/□ (1 k$\Omega$ per square).

To test the TSVs, only one side of the silicon interposer 120 is probed. In one embodiment, the side with larger solder balls, or larger contact-to-contact pitch, is probed to reduce the complexity of the probing step. In some embodiments, two probe points on the silicon die are probed to test the metal interconnects. This way two TSVs can be tested at the same time. In other embodiments, one probe probes to a terminal of the silicon interposer and the other probe probes the wafer tape 201 or a conductive chuck to which the wafer tape 201 is attached.

In one embodiment, to reduce the effect of the probe resistance, a four point probe method is used to determine the test resistance. In other embodiments, the probe resistance might be negligible and a two probe measurement can be used to determine the test resistance.

In other embodiments, the side with smaller solder balls, or smaller contact-to-contact pitch is probed. The side with smaller solder balls may contain a larger number of probing points that may not be able to be tested if the side with larger solder balls is probed. For instance, a silicon interposer may include a connection between a first solder ball on side with smaller solder ball to a second solder ball on the side with smaller solder balls. If the side with larger solder balls is probed instead, the connection between the first solder ball and the second solder ball may not be able to be tested.

In some embodiments, the silicon interposer may include a polished side and an unpolished side. In one embodiment, the polished side of the silicon interposer may be probed. This may ease the integration of the testing step with the fabrication process. Additionally, in some embodiments, the polished side of the silicon interposer may contain alignment marks that may be used to guide test equipment in finding the probe points of the silicon interposer.

Figure 3:
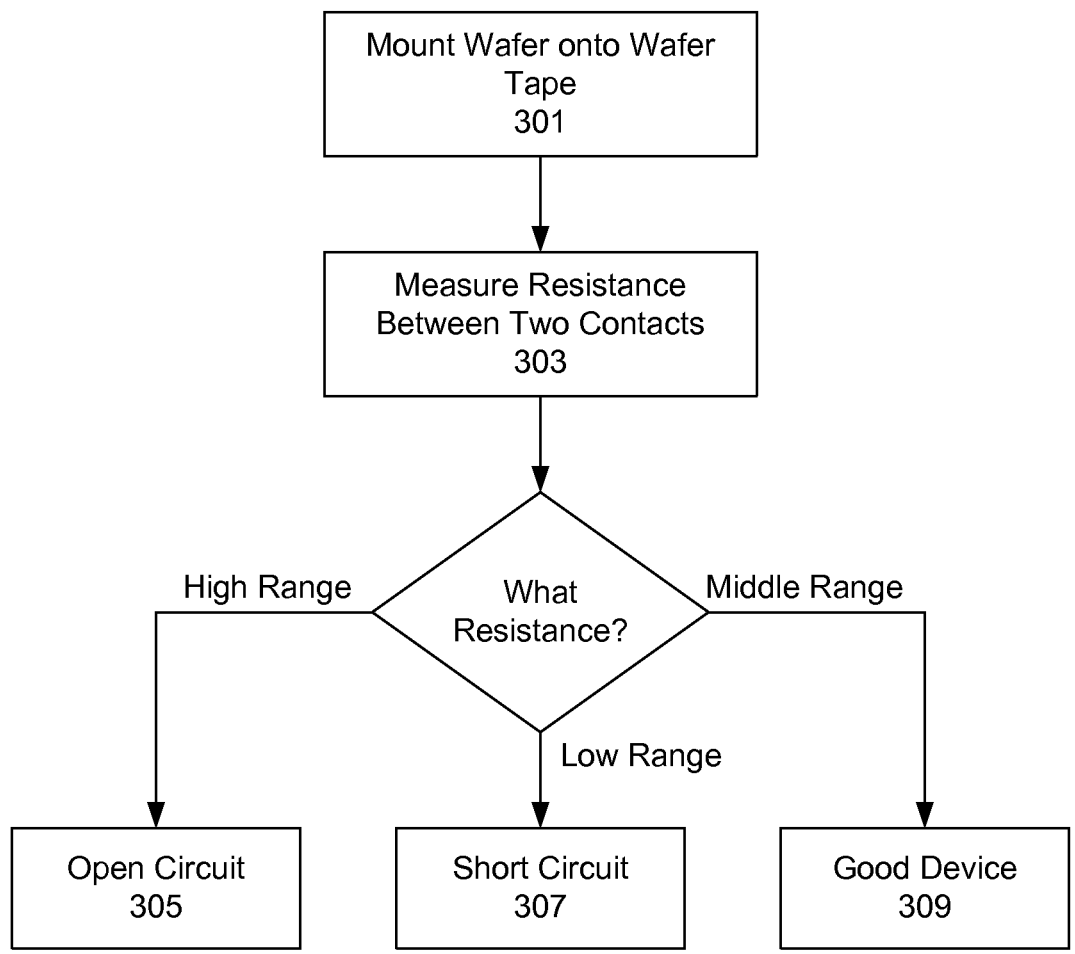
FIG. 3 is a flow diagram of a method for testing TSVs, according to one embodiment of the invention.

FIG. 3 is a flow diagram of a method for testing TSVs of a silicon interposer. The wafer 203 is mounted 301 onto the wafer tape 201. The resistance between two probe points or contacts (e.g., between two bumps 125) is measured 303. If the measured resistance is too high, then the silicon interposer 120 may have an open circuit 305. If the measured resistance is too low, then the silicon interposer 120 may have a short circuit 307. If the measured resistance falls within an expected range, this indicates that the silicon interposer has no defects. In one embodiment, this process is repeated until all the TSVs are tested.

In some embodiments, a low range resistance is defined as a resistance that is below a certain lower threshold (e.g., less than 10$\Omega$), a high range resistance is defined as a resistance that is above a certain upper threshold (e.g., more than 1 G$\Omega$), and a middle range resistance (acceptable resistance) is defined as a resistance measured between two thresholds that fall between the upper and lower thresholds (e.g., between 10$\Omega$ and 1 G$\Omega$). The thresholds may be predetermined, or they may be dynamically adjusted as measurements are taken.

In one embodiment, there are guard bands between the different ranges. For example, the middle range resistance may be defined as between 1 k$\Omega$ and 1 M$\Omega$, rather than between 10$\Omega$ and 1 G$\Omega$. If the measured resistance falls outside one of the defined ranges, then the test might be considered inconclusive and further testing (e.g., testing the via through other contacts) might be performed.

In some embodiments, the ranges for low range resistance, middle range resistance, and high range resistance are based on the distance between the TSVs of a TSV pair. For instance, the thresholds for a middle range resistance may be higher for a TSV pair with a larger distance between TSVs, and the thresholds for a middle range resistance may be lower for a TSV pair with a shorter distance between TSVs.

Figure 4D:
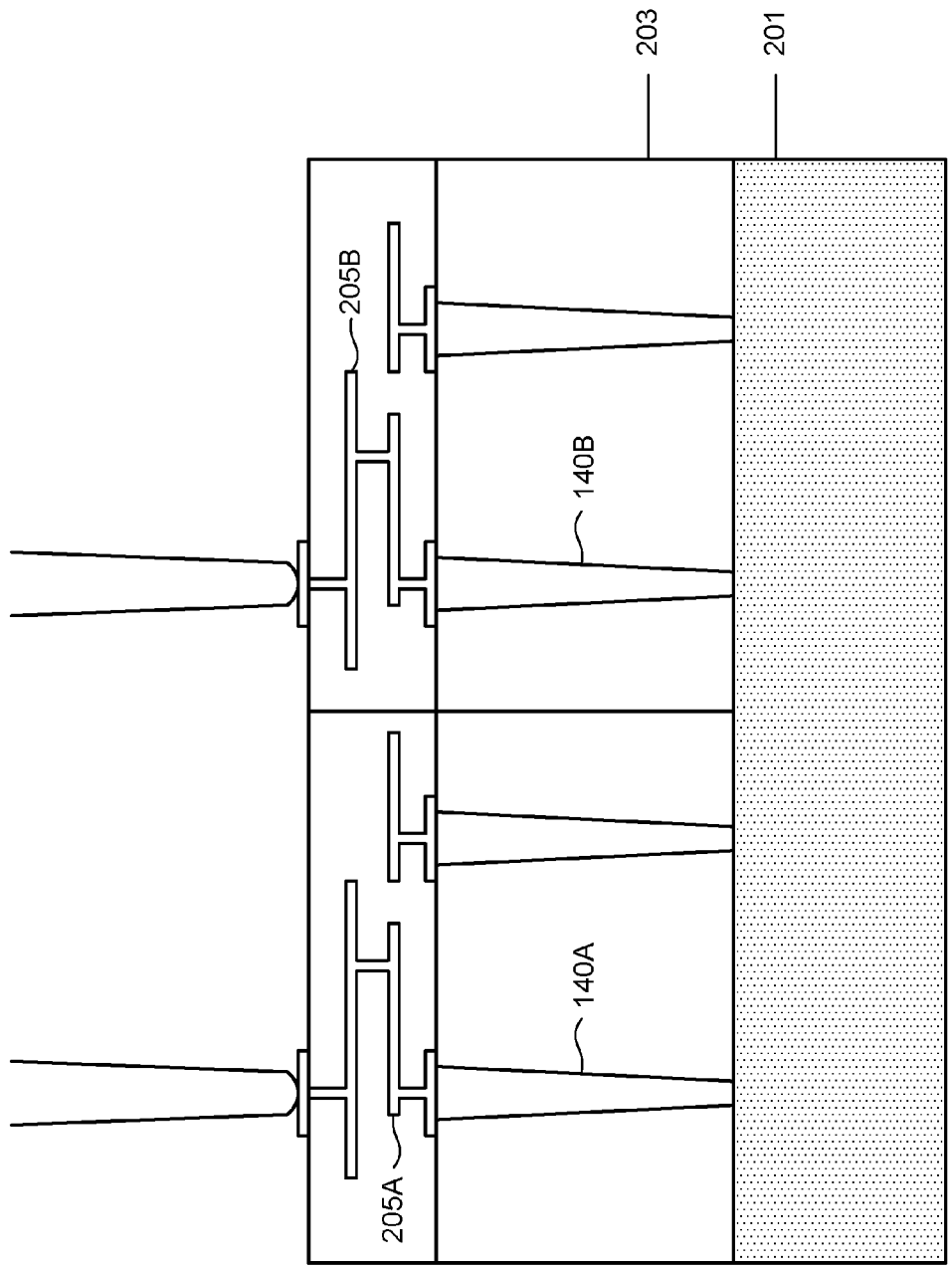
FIG. 4D is a side cross sectional view of a silicon die being probed, according to one embodiment of the invention.
Figure 5:
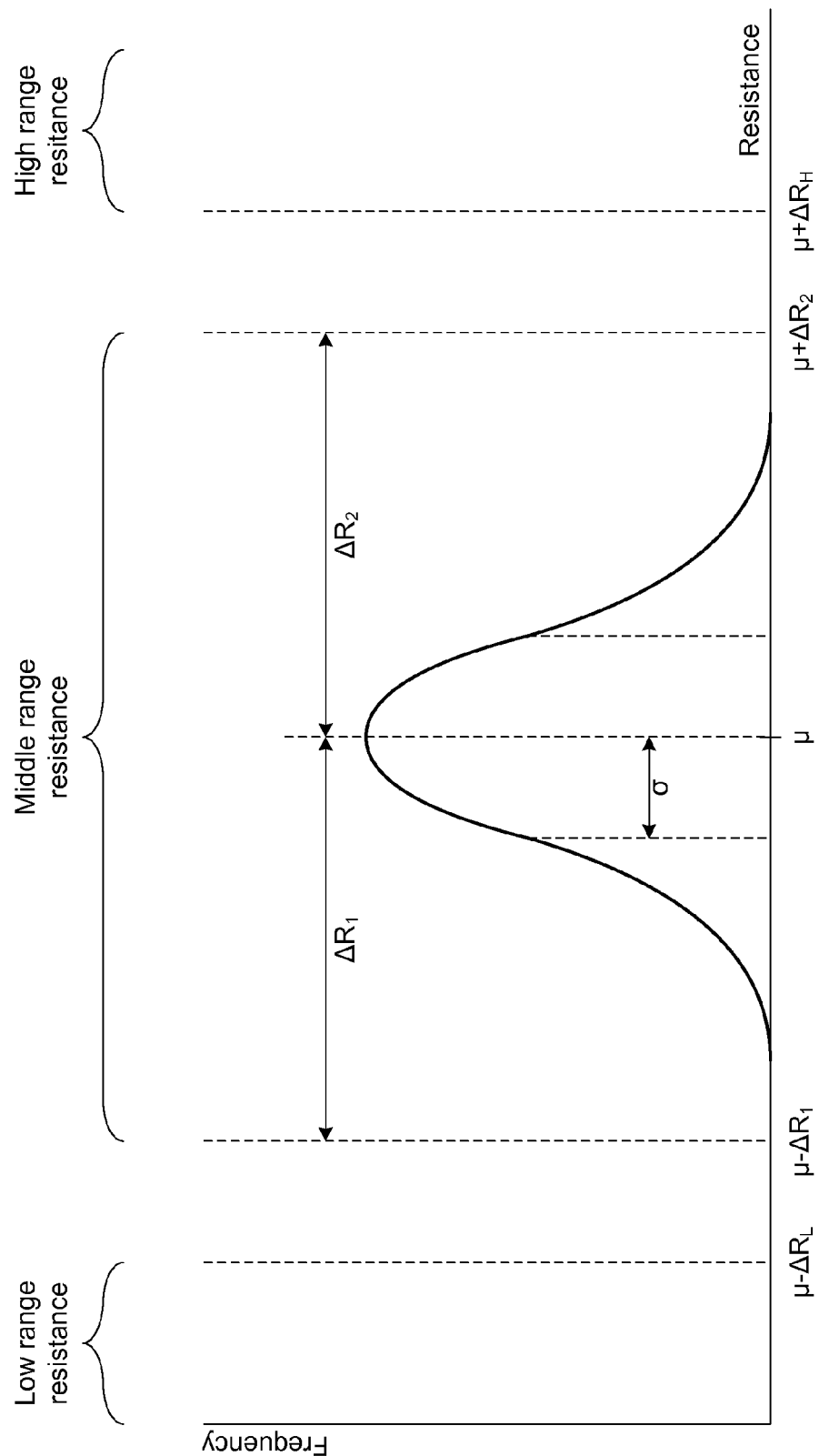
FIG. 5 illustrates a statistical distribution of measured resistances between two contacts of multiple silicon interposers, according to one embodiment of the invention.

In some embodiments, a statistical distribution is determined based on multiple measurements of resistance between different sets of probe points. The probe points could be different probe points on the same die or, as illustrated in FIG. 4D, they could be the same probe points on different dies. Based on the statistical distribution, a mean value ($\mu$) and a standard deviation value ($\sigma$) may be determined for the distribution of the resistances. FIG. 5 illustrates a distribution of the resistance between the two contacts for multiple silicon interposers 120.

In some embodiments, a statistical distribution is determined based on multiple measurements of resistance between different sets of probe points. The probe points could be different probe points on the same die or they could be the same probe points on different dies. Based on the statistical distribution, a mean value ($\mu$) and a standard deviation value ($\sigma$) may be determined for the distribution of the resistances. FIG. 5 illustrates a distribution of the resistance between the two contacts for multiple silicon interposers 120.

In some embodiments, a low range resistance is defined as an outlier in the lower tail of the statistical distribution of the resistance. In other embodiments, a low range resistance is defined as a resistance that is lower than a certain number of standard deviations from the mean value of the resistance distribution. For example, a low range resistance may be defined as a resistance that is lower than the mean value of the resistance distribution minus 5 times the standard deviation of the resistance distribution.

In yet other embodiments, a low range resistance is defined as a resistance that is lower than the mean value of the resistance distribution minus a certain resistance value. For example, a low range resistance may be defined as a resistance lower than the mean value of the resistance distribution minus 1 kΩ. The threshold for a low range resistance may be defined as a percentage of the mean value of the resistance distribution. For example, a low range resistance may be defined as a resistance lower than 25% of the mean value of the resistance distribution.

In some embodiments, a high range resistance is defined as an outlier in the upper tail of the statistical distribution of the resistance. In other embodiments, a high range resistance is defined as a resistance that is above a certain number of standard deviations from the mean value of the resistance distribution. For example, a high range resistance may be defined as a resistance that is larger than the mean value of the distribution plus 5 times the standard deviation of the resistance distribution.

In yet other embodiments, a high range resistance is defined as a resistance that is larger than the mean value of the resistance distribution plus a certain resistance value. For example, a high range resistance may be defined as a resistance larger than the mean value of the resistance distribution plus 1 MΩ. The threshold for a high range resistance may be defined as a percentage of the mean value of the resistance distribution. For example, a high range resistance may be defined as a resistance larger than 1000% of the mean value of the resistance distribution.

In some embodiments, middle range resistance (acceptable resistance) is defined as a resistance that is within a certain number of standard deviations from the mean value of the resistance distribution. For example, a middle range resistance may be defined as a resistance that is within 3 standard deviations from the mean value of the resistance distribution. That is, a middle range resistance may be a resistance that is larger than the mean value minus 3 times the standard deviation of the resistance distribution and lower than the mean value plus 3 times the standard deviation of the resistance distribution.

In yet other embodiments, a middle range resistance is defined as a resistance that is larger than the mean value of the resistance distribution minus a first resistance value and is lower than the mean value of the resistance distribution plus a second resistance value. For example, a middle range resistance may be defined as a resistance larger than the mean value of the resistance distribution minus 1 kΩ and lower than the mean value of the resistance distribution minis 1 MΩ. The threshold for a middle range resistance may be defined as a percentage of the mean value of the resistance distribution. For example, a middle range resistance may be defined as a resistance larger than 25% of the mean value of the resistance distribution and lower than 1000% of the mean value of the resistance.

In yet other embodiments, the mode of the distribution is used instead of the mean of the distribution to define a low range, middle range and high range resistance. As used herein, the mode of a distribution is the value that appears most often in a set of data. The mode of a distribution may be determined as the peak value of the probability mass function (PMF) or the peak value of the probability density function of the distribution. For instance, a low range resistance may be defined as a resistance that is a set number of standard deviations lower than the mode of the resistance distribution (e.g., lower than 5 standard deviations from the mode of the resistance distribution).

In some embodiments, a different resistance distribution is determined for different TSV pairs. For instance, a resistance distribution may be determined for a TSV pair based on the resistance of the TSV pair in multiple silicon dies. In other embodiments, TSV pairs are grouped based on the distance between each of the TSVs of the TSV pair and a resistance distribution is determined for each group. For instance, TSV pairs may be grouped into 3 groups. The first group may include TSV pairs with a distance shorter than 1 mm, the second group may include TSV pairs with a distance between 1 mm and 5 mm, and the third group may include TSV pairs with a distance larger than 5 mm.

In yet other embodiments, a single resistance distribution is determined. In one embodiment, the mean value of the resistance distribution, or the mode of the resistance distribution is adjusted based on the distance between the TSVs of a TSV pair when determined whether a TSV pair has a low range resistance, a middle range resistance, or a high range resistance. For instance, an adjustment value may be added to the mean value or the mode of the resistance distribution for TSV pairs with a large distance between each of the TSVs. In another example, an adjustment value may be subtracted from mean value or the mode of the distribution for TSV pairs with short distances between each of the TSVs.

FIG. 5 illustrates a distribution of measure resistances between two contacts of multiple silicon interposers, according to one embodiment of the invention. Although the embodiment of FIG. 5 is illustrated as a normal distribution, the measured resistances may exhibit any other type of distribution. For instance, the measure resistance may exhibit a gamma distribution or a Cauchy distribution.

In the example of FIG. 5, a resistance value that is lower than $\mu-\Delta R_L$ is a low range resistance, a resistance that is between $\mu-\Delta R_1$ and $\mu+\Delta R_2$ is a middle range resistance, and a resistance that is larger than $\mu+\Delta R_H$ is a high range resistance. As such, the result of the TSV testing may be as follows $$\begin{cases} R_{measured} < \mu - \Delta R_L & \text{short circuit} \\ \mu - \Delta R_1 < R_{measured} < \mu + \Delta R_2 & \text{working properly} \\ R_{measured} > \mu + \Delta R_H & \text{open circuit} \end{cases}$$

Figure 4A:
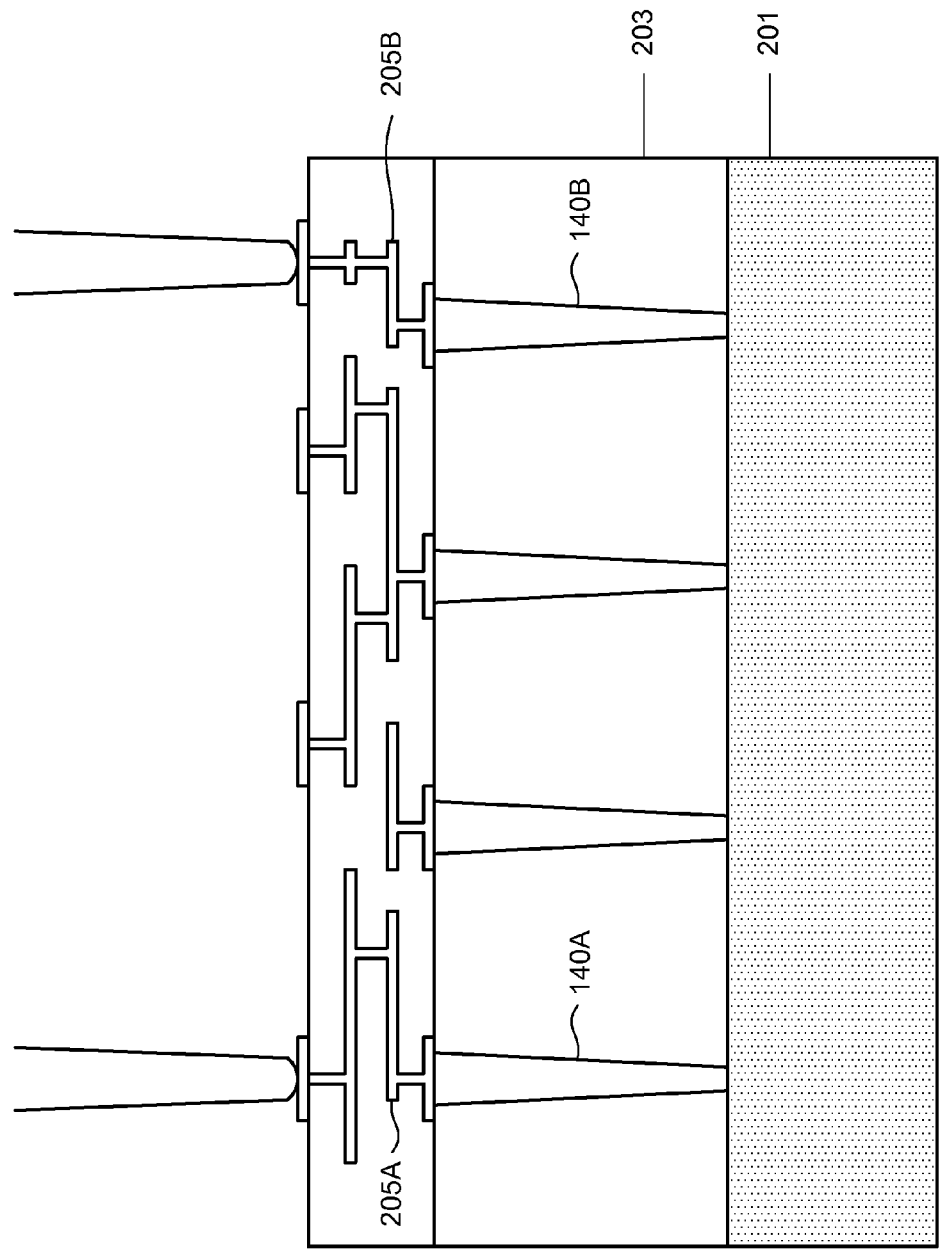
FIG. 4A is a side cross sectional view of a silicon die being probed, according to one embodiment of the invention.
Figure 4B:
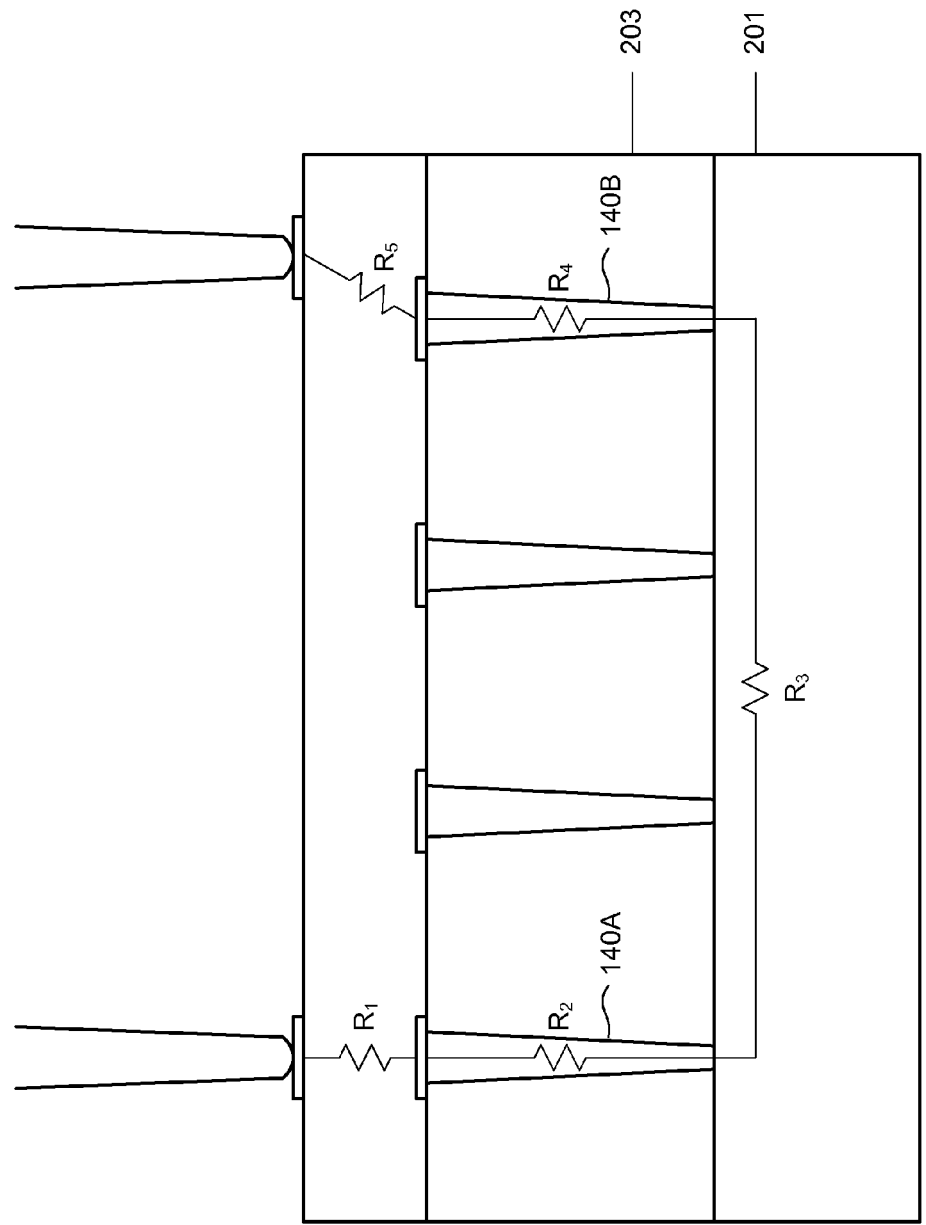
FIG. 4B is a circuit diagram modeling the resistance measured when testing TSVs, according to one embodiment of the invention.

FIG. 4A shows a cross sectional view of a silicon die being probed, and FIG. 4B shows a circuit diagram for the resistance measured when testing the TSVs of the silicon interposer of FIG. 4A. The measured resistance has five resistance components: the resistance of traces 205A near the first probe ($R_1$), the resistance of a first TSV 140A ($R_2$), the resistance of the wafer tape 201 between the two TSVs ($R_3$), the resistance of a second TSV 140B ($R_4$) and the resistance of traces 205B near the second probe ($R_5$). The resistance measured ($R_T$) is the combination of $R_1$, $R_2$, $R_3$, $R_4$ and $R_5$ in series:

$$R_T = R_1 + R_2 + R_3 + R_4 + R_5$$

In some embodiments, the resistivity of the wafer tape 201 can be chosen in a way that $R_1$, $R_2$, $R_4$ and $R_5$ are negligible compared to $R_3$ (e.g., 1 kΩ/□). Therefore, the resistance to be measured can be determined based on the resistivity of the wafer tape 201 and the distance between the two TSVs under test. In some embodiments other resistances, such as the resistance of the probes and/or instruments may also be present in the total measure resistance $R_T$.

Defect detection can be based on more than one measurement. For instance, if the measured resistance between two probe points indicates an open, it is not clear where the open occurs. It could occur in either of the two TSVs (or elsewhere along the conductive path). However, taking multiple measurements with different combinations of TSVs can be used to more definitively determine what defects are present and where they are present. For instance, if all measured resistances between a specific TSV and any other TSV indicate an open, that is strong evidence that specific TSV has an open.

In some embodiments the wafer tape has a photosensitive adhesive. For instance, the adhesion strength of the adhesive layer of the wafer tape may reduce after being exposed to light. In some embodiments, the strength of the adhesive layer may reduce after being exposed to a specific light wavelength (e.g., light in the ultraviolet or UV spectrum). The strength of the adhesive layer may also depend on the amount of time the adhesive layer is exposed to light.

In some embodiments, the wafer tape may contain metallic particles to create a conductive layer on the surface of the wafer tape. In other embodiments, the wafer tape may include a metal film. In some embodiments, the wafer tape may include multiple layers. For instance, the wafer tape may include an adhesive layer to attach the wafer tape to the silicon wafer, a resistive layer 401, and a conducting layer 403.

Figure 4C:
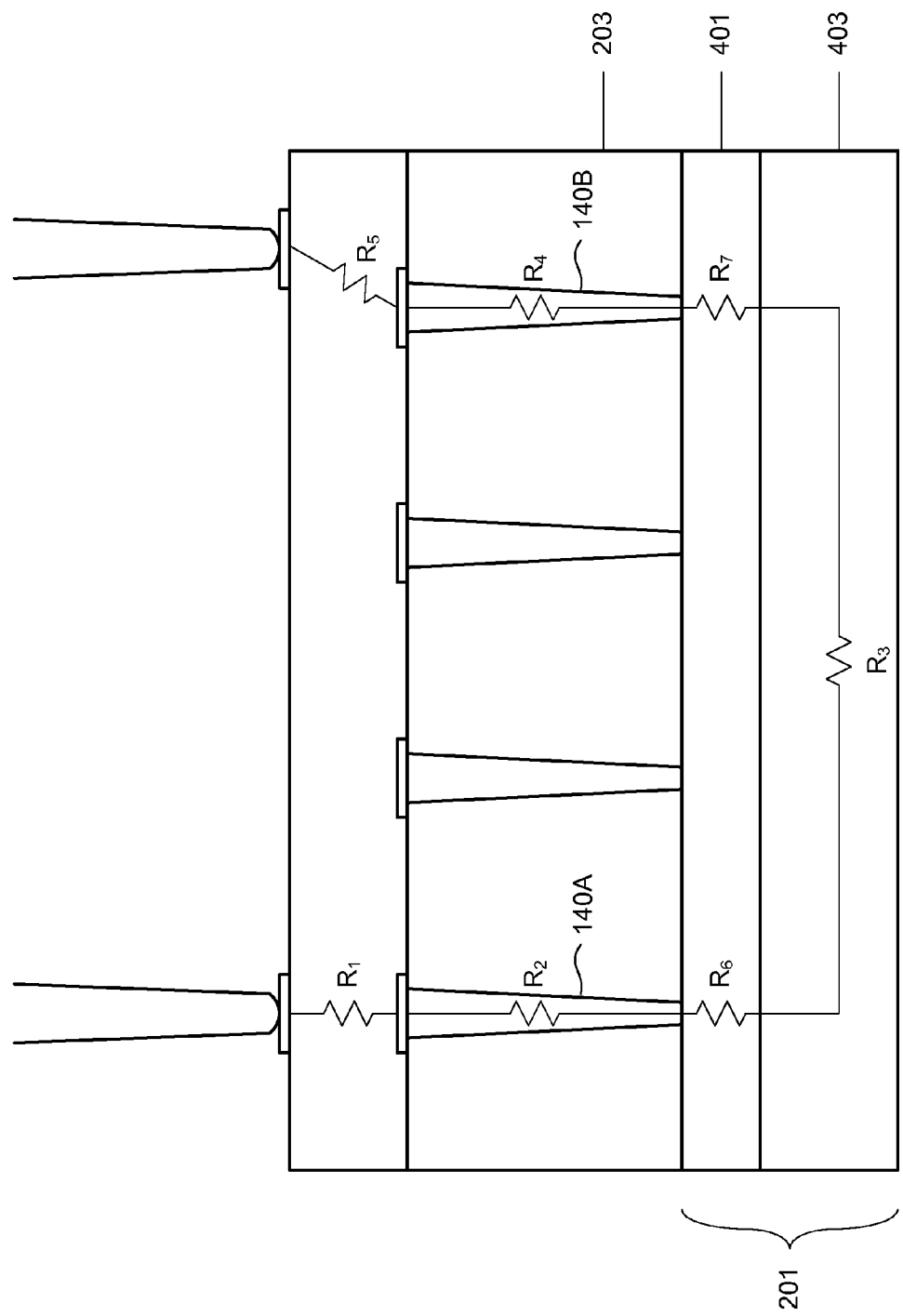
FIG. 4C is a circuit diagram modeling the resistance measured when testing TSVs with a wafer tape that includes a conductive layer and a resistive layer, according to one embodiment of the invention.

For instance, as illustrated in FIG. 4C, the resistance measured between two probes of the silicon interposer may have seven components: the resistance of traces 205A near the first probe ($R_1$), the resistance of a first TSV 140A ($R_2$), the resistance across the resistive layer of the wafer tape ($R_6$), the resistance of the conductive layer between the two TSVs ($R_3$), the resistance across the resistive layer of the wafer tape ($R_7$), the resistance of a second TSV 140B ($R_4$) and the resistance of traces 205B near the second probe ($R_5$). Having a conductive layer underneath a resistive layer may reduce the difference in resistance between TSV pairs with a various distances separating each of the TSVs of the TSV pairs.

In one embodiment, as illustrated in FIG. 2B, the wafer tape allows the bumps 125 of the silicon interposer to protrude into the wafer tape to increase the quality of the contact between the bump 125 and the wafer tape 201.

Other variations will also be apparent. For example, the approaches described above are not limited to silicon die or silicon interposers. Electronic devices other than silicon die or silicon interposers could also be probed. The interconnect also is not required to be a TSV. Other types of through-wafer interconnects could also be probed. As a final example, conducting or partially conducting materials other than wafer tape could be used.

Although the detailed description contains many specifics, these should not be construed as limiting the scope of the invention but merely as illustrating different examples and aspects of the invention. It should be appreciated that the scope of the invention includes other embodiments not discussed in detail above. Various modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A method for testing thru-silicon vias (TSVs) in a silicon die, the TSVs for providing interconnection between opposite sides of the silicon die, the method comprising:
   mounting the silicon die on wafer tape, the wafer tape having a resistivity that is sufficiently low to form a conductive path between TSVs;
   for different sets of two probe points, contacting the two probe points on the exposed side of the silicon die, each probe point electrically connected to one of two different TSVs, wherein the different sets of two probe points are a same pair of probe points on different dies;
   measuring a resistance between the two probe points; and
   determining an electrical integrity of the two TSVs based on the measured resistance.

2. The method of claim 1, wherein the silicon die comprises contacts with a first pitch on the exposed side of the silicon die and contacts with a second pitch on the taped side of the silicon die, and the first pitch is less than the second pitch.

3. The method of claim 1, wherein the silicon die comprises contacts with a first pitch on the exposed side of the silicon die and contacts with a second pitch on the taped side of the silicon die, and the first pitch is larger than the second pitch.

4. The method of claim 1, wherein determining the electrical integrity of the two TSVs comprises:
   determining a presence of a defect, based on the measured resistance relative to a threshold resistance.

5. The method of claim 4, wherein the defect is a short and determining the electrical integrity of the two TSVs comprises determining that a short exists if the measured resistance is below the threshold resistance.

6. The method of claim 4, wherein the defect is an open and determining the electrical integrity of the two TSVs comprises determining that an open exists if the measured resistance is above the threshold resistance.

7. The method of claim 4, wherein the threshold resistance is a predetermined threshold resistance.

8. The method of claim 4, further comprising:
   determining a statistical distribution of the measured resistances between the two probe points; and
   determining the threshold resistance based on a statistical distribution of the measured resistances.

9. The method of claim 8, wherein determining the electrical integrity of the two TSVs comprises:
   determining a presence of a defect, if the measured resistance is an outlier of the statistical distribution of the measured resistances.

10. The method of claim 8, wherein the defect is a short and determining the electrical integrity of the two TSVs comprises determining that a short exists if the measured resistance is a threshold amount below an average measured resistance.

11. The method of claim 8, wherein the defect is an open and determining the electrical integrity of the two TSVs comprises determining that an open exists if the measured resistance is a threshold amount above an average measured resistance.

12. The method of claim 8, wherein the threshold resistance is based on an average and on a standard deviation of the statistical distribution.

13. The method of claim 4, further comprising:
for different sets of two probe points, contacting the two probe points and measuring resistances between the two probe points; and
determining a presence of a defect in an individual TSV based on two or more measured resistances in which one probe point is connected to that individual TSV and the other probe point is connected to a different TSV.

14. The method of claim 1, wherein the wafer tape comprises a photo sensitive adhesive.

15. The method of claim 1, wherein the wafer tape is mounted on a wafer ring, the wafer ring comprising at least one alignment mark.

16. The method of claim 1, wherein a resistivity of the wafer tape is higher than a resistivity of the TSVs.

17. A non-transitory computer readable medium storing instructions for testing thru-silicon vias (TSVs) in a silicon die, the TSVs for providing interconnection between opposite sides of the silicon die, the instructions when executed by a processor cause the processor to:
receive a resistance measurement between different sets of two probe points of the silicon die, the silicon die mounted on a wafer tape, the wafer tape having a resistivity that is sufficiently low to form a conductive path between TSVs, each probe point electrically connected to one of two different TSVs, wherein the different sets of two probe points are a same pair of probe points on different dies; and
determine an electrical integrity of the two TSVs based on the received resistance measurement.

18. The non-transitory computer readable medium of claim 17, wherein determining an electrical integrity of the two TSVs comprises determining a presence of a defect, wherein the defect is one of:
a short and determining the electrical integrity of the two TSVs comprises determining that a short exists if the measured resistance is below a first threshold resistance; and
an open and determining the electrical integrity of the two TSVs comprises determining that an open exists if the measured resistance is above a second threshold resistance;
wherein the first threshold resistance and the second threshold resistance are based on a resistance of a TSV and the resistivity of the wafer tape.

* * * * *